(12) United States Patent
A Tharumalingam et al.

(10) Patent No.: US 11,894,352 B2
(45) Date of Patent: Feb. 6, 2024

(54) POWER ELECTRONIC MODULE WITH ENHANCED THERMAL AND ELECTRICAL PERFORMANCE

(71) Applicant: Renesas Electronics America Inc., Milpitas, CA (US)

(72) Inventors: Sri Ganesh A Tharumalingam, Fremont, CA (US); Mark Kwoka, Palm Bay, FL (US); Viresh Piyush Patel, Austin, TX (US); Peter Zhizheng Liu, Fremont, CA (US); Jeff Strang, Durham, NC (US)

(73) Assignee: Renesas Electronics America Inc., Milpitas, CA (US)

( * ) Notice: Subject to any disclaimer, the term of this patent is extended or adjusted under 35 U.S.C. 154(b) by 267 days.

(21) Appl. No.: 17/323,166

(22) Filed: May 18, 2021

(65) Prior Publication Data

US 2022/0375909 A1 Nov. 24, 2022

(51) Int. Cl.
*H01L 25/16* (2023.01)
*H01L 23/367* (2006.01)
*H05K 7/02* (2006.01)

(52) U.S. Cl.
CPC ........ *H01L 25/162* (2013.01); *H01L 23/3675* (2013.01); *H05K 7/02* (2013.01)

(58) Field of Classification Search
CPC ...... H01L 25/162; H01L 23/3675; H05K 7/02
USPC ......................................................... 361/760
See application file for complete search history.

(56) References Cited

U.S. PATENT DOCUMENTS

| 2016/0233140 A1* | 8/2016 | Lai ..................... H01L 25/0655 |
| 2017/0025379 A1* | 1/2017 | Liang ................... H01L 25/18 |

* cited by examiner

*Primary Examiner* — Andargie M Aychillhum
(74) *Attorney, Agent, or Firm* — SCULLY, SCOTT, MURPHY & PRESSER, P.C.

(57) ABSTRACT

A power electronic module is provided that includes an electrical connection on opposing surfaces of an electronic component that allows a high current path from a top board to a bottom board through the body of the electronic component thus improving the power electronic module's electrical resistance and reducing the current load on the connector structure which is located between the first substrate and the second substrate. The power electronic module further includes a semiconductor component positioned on an external surface of the top board which allows for thermal contact of the semiconductor component with an external heat sink thus providing an efficient system thermal management via a reduced heat dissipation path. Additional heat dissipation can be obtained by disposing a metallic spacer on the semiconductor component of the power electronic module of the present disclosure.

20 Claims, 5 Drawing Sheets

POWER ELECTRONIC MODULE WITH ENHANCED THERMAL AND ELECTRICAL PERFORMANCE

FIELD OF THE DISCLOSURE

The present disclosure relates to semiconductor technology. More particularly, the present disclosure relates to a power electronic module having higher current density, improved electrical resistance, and efficient system thermal management.

BACKGROUND

Smart power stage components are semiconductor components that are commonly used in high powered applications for switching high currents and operating on high voltages. Smart power stage components include an integrated driver, and a power converter having switching elements such as a high side (or upper) metal oxide semiconductor field effect transistor (MOSFET) and a low side (or lower) MOSFET. Smart power stage components are typically internally connected to each other to provide a certain circuit structure. Smart power stage components are used, for example, for producing certain power conversion circuits, such as inverters and converters.

Smart power stage components generally include a metallic spacer which is typically composed of copper. The purpose of the metallic spacer is to conduct the heat generated by the smart power stage components to a cooling device, such as a heat sink. The smart power stage components heat loss is dissipated mainly via the smart power stage components' metallic spacer that has to be in good thermal contact with a proper cooling device.

As internal electronic module packing density increases gradually with advanced construction materials and manufacturing methods, there is a need for providing more efficient system thermal management for electronic modules including smart power stage components. Also, there is a need for providing electronic modules including smart power stage components that exhibit enhanced electrical performance.

SUMMARY

A power electronic module is provided that includes an electrical connection on opposing surfaces of an electronic component, e.g., an inductor, that allows a high current path from a top board (e.g., a second substrate) to a bottom board (e.g., a first substrate) through the body of the electronic component thus improving the power electronic module's electrical resistance and reducing the current load on the connector structure which is located between the top board and the bottom board. The power electronic module of the present disclosure further includes a semiconductor component, e.g., a smart power stage component, positioned on an external surface of the top board which allows for thermal contact of the semiconductor component with an external heat sink thus providing an efficient system thermal management via a reduced heat dissipation path. In the present disclosure, one component is said to be in thermal contact with another if it can exchange energy with it through the process of heat. Additional heat dissipation can be obtained by disposing a metallic spacer on the semiconductor component of the power electronic module of the present disclosure.

In one aspect of the present disclosure, a power electronic module having enhanced electrical and thermal properties is provided. In one embodiment of the present disclosure, the power electronic module includes a first substrate having a first surface and a second surface opposite the first surface. A second substrate is also present that is spaced apart from the first substrate. The second substrate has a third surface and a fourth surface that is opposite the third surface. The third surface of the second substrate faces the second surface of the first substrate.

The power electronic module of the present disclosure further includes a first electronic component located between the second surface of the first substrate and the third surface of the second substrate. The first electronic component has a first terminal and a second terminal. A connector structure is also present between the first substrate and the second substrate. Notably, the connector structure laterally surrounds the first electronic component and connects the first substrate and the second substrate.

The power electronic module further includes a semiconductor component located on the fourth surface of the second substrate. In accordance with the present disclosure, the semiconductor component is electrically connected with the first substrate via the first terminal and the second terminal, and the first terminal of the first electronic component electrically contacts the first substrate, and the second terminal of the first electronic component electrically contacts the second substrate.

The aforementioned electrical connection allows a high current path from the top board (e.g., second substrate) to the bottom board (e.g., first substrate) through the first electronic component thus improving the module's electrical resistance and reducing the current load on the connector structure that connects the top board to the bottom board. Further, the location of the semiconductor component on the fourth surface (i.e., external surface) of the second substrate allows a reduced heat dissipation path.

In the power electronic module of the present disclosure, the first terminal and the second terminal of the first electronic component are connected to each other by an electrically conductive structure that provides a body of the first electronic component.

In some embodiments of the present disclosure, the power electronic module further includes a second electronic component that is spaced apart from the first electronic component and is located on the second substrate. In some embodiments, the second electronic component is located on the third surface of the second substrate. In other embodiments, the second electronic component is located on the fourth surface of the second substrate and is spaced apart from the semiconductor component.

In some embodiments of the present disclosure, the first terminal of the first electronic component electrically contacts the second surface of the first substrate and a portion of the second terminal of the first electronic component extends through the second substrate. In the context of the present disclosure and when referring to the second terminal, the term "extends through" is used to denote that a portion of the second terminal of the first electronic component passes through the second substrate from the third surface to the fourth surface.

In accordance with other embodiments of the present disclosure, the first terminal of the first electronic component electrically contacts the second surface of the first substrate and the second terminal of the first electronic component electrically contacts the third surface of the second substrate.

In some embodiments of the present disclosure, the first electronic component is an inductor, and the second electronic component, if present, is at least one capacitor. In some embodiments of the present disclosure, the semiconductor component is a smart power stage component having a metallic spacer located on a surface thereof. In embodiments in which the semiconductor component is a smart power stage component, the smart power stage component includes at least a power converter having a switching element including a high side MOSFET and a low side MOSFET. In some embodiments of the present disclosure, a heat sink thermally contacts a surface of the semiconductor component. For example, and in one embodiment, the heat sink can thermally contact the metallic spacer that is located on the semiconductor component.

In some embodiments of the present disclosure, the first electronic component is disposed in a housing substrate that is spaced apart from the connector structure.

In some embodiments of the present disclosure, the connector structure includes a frame board having a plurality of electrically conductive structures embedded therein. In yet other embodiments of the present disclosure, the connector structure includes a housing substrate having a plurality of electrically conductive structure embedded therein. In some embodiments, an electrically conductive pin is located at an end of each of the plurality of electrically conductive structures. In yet further embodiments of the present disclosure, the connector structure includes a plurality of vertically stacked substrates having a plurality of electrically conductive structures embedded therein. In some embodiments, the first electronic component can be embedded in the plurality of vertically stacked substrates which provide the connector structure. Other electronic components such as, for example, inductors, capacitors and resistors can be embedded in the vertically stacked substrates.

DETAILED DESCRIPTION

Figure 1:
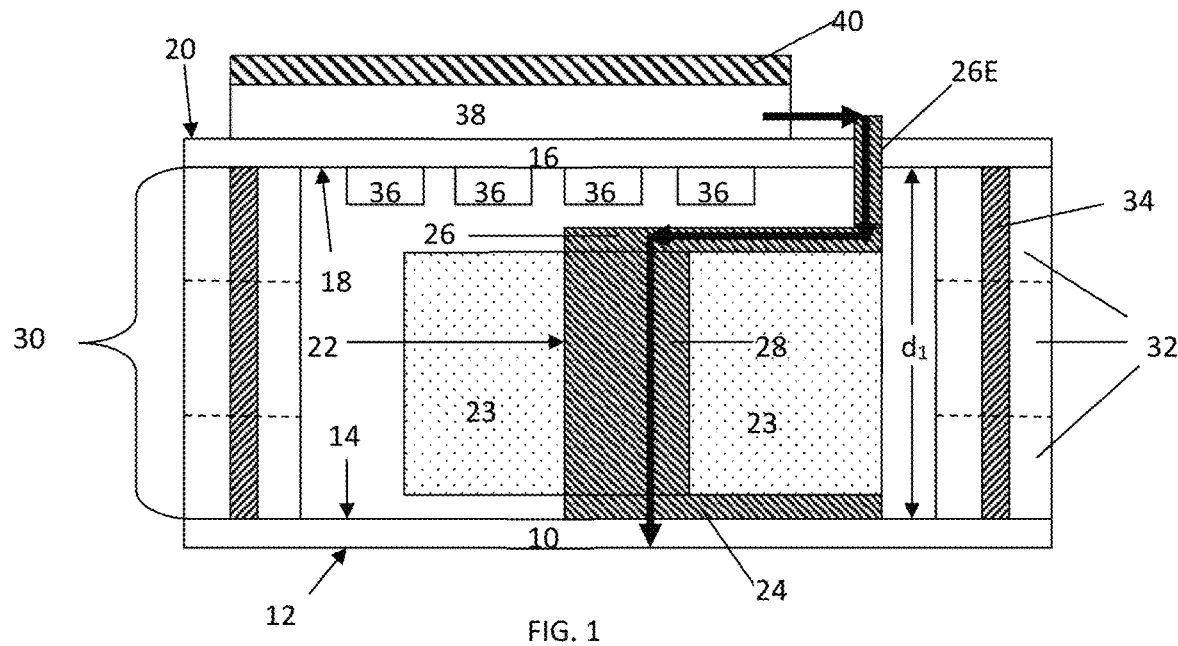
FIG. 1 is a cross-sectional view of a power electronic module in accordance with one embodiment of the present disclosure.

The present disclosure will now be described in greater detail by referring to the following discussion and drawings that accompany the present application. It is noted that the drawings of the present disclosure are provided for illustrative purposes only and, as such, the drawings are not drawn to scale. It is also noted that like and corresponding elements that are present in the drawings are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present disclosure may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising", when used in this disclosure, specify the presence of stated features, integers, steps, operations, elements, and/or components, but do not preclude the presence or addition of one or more other features, integers, steps, operations, elements, components, and/or groups thereof.

A power electronic module is disclosed having improved electrical resistance, higher current density and efficient system thermal management. The term "higher current density" is used herein to denote that the power electronic module of the present disclosure has high current application in a compact footprint as compared with prior art power electronic modules. The electrical resistance in the power electronic module of the present disclosure is improved via the stacking approach in construction of the module whereby the distance between the semiconductor components and electronic components are reduced significantly while having a compact footprint compared with a conventional approach. The shorter current travel path provided in the present disclosure, reduces resistance and electrical parasitics. The power electronic module of the present disclosure can be operated at various current and voltage levels. The improved electrical resistance and higher-current density of the power electronic module of this disclosure are obtained by providing an electrical connection on opposing surfaces of an electronic component, e.g., an inductor, which allows a high current path from a top board (e.g., a second substrate) to a bottom board (e.g., first substrate) through the body of the electronic component. The power electronic module further includes a semiconductor component, e.g., a smart power stage component, positioned on an external surface of the top board (e.g., second substrate) which allows for thermal contact of the semiconductor component with an external heat sink thus providing an efficient system thermal management via a reduced heat dissipation path. Additional heat dissipation can be obtained by disposing a metallic spacer on the semiconductor component of the power electronic module of the present disclosure. These and other aspects of the present disclosure will now be described in greater detail.

Figure 2:
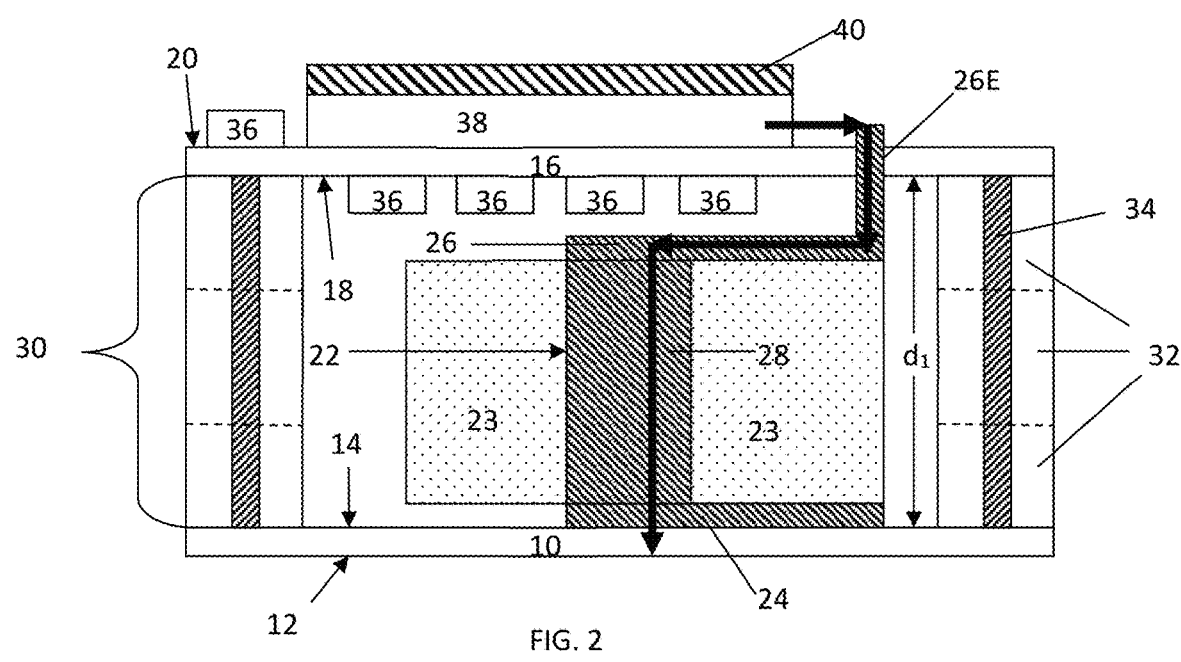
FIG. 2 is a cross-sectional view of a power electronic module in accordance with another embodiment of the present disclosure.

Referring first to FIG. 1, there is illustrated a power electronic module in accordance with one embodiment of the present disclosure; FIG. 2 shows a variation of the power electronic module shown in FIG. 1. The exemplary power electronic modules shown in FIGS. 1 and 2 each include a first substrate (e.g., bottom board) 10 having a first surface 12 and a second surface 14 opposite the first surface 12; the first substrate 10 may also be referred to as a first board. The first substrate 10 that is employed in the present disclosure comprises any organic substrate that is typically used in semiconductor packaging. In one example, the first substrate 10 comprises a glass epoxy resin. In yet another embodiment of the present disclosure, the first substrate 10 may comprise resin, glass fibers, epoxy and copper traces. The first substrate 10 can have a thickness from 0.1 mm to 0.5 mm. However, other thicknesses for the first substrate 10 are contemplated and can be used as the thickness of the first substrate 10.

The exemplary power electronic modules of FIGS. 1 and 2 further include a second substrate (e.g., top board) 16 having a third surface 18 and a fourth surface 20 that is opposite the third surface 18; the second substrate 16 may also be referred to as a second board. The terms "first surface", "second surface", "third surface" and "fourth surface" are used in the present disclosure as a way of distinguishing the various surfaces of the first substrate 10 and the second substrate 16 from each other. In accordance with the present disclosure, the third surface 18 of the second substrate 16 faces the second surface 14 of the first substrate 10.

The second substrate 16 that is employed in the present disclosure comprises any organic substrate that is typically used in semiconductor packaging. In some embodiments, the second substrate 16 is a same (in terms of composition) organic substrate as the first substrate 10. In other embodiments, the second substrate 16 is a different (in terms of composition) organic substrate than the first substrate 10. The second substrate 16 can have a thickness from 0.1 mm to 0.5 mm. However, other thicknesses for the second substrate 16 are also contemplated and can be employed in the present disclosure.

In accordance with the present disclosure, and as is shown in FIGS. 1 and 2, the second substrate 16 is spaced apart from the first substrate 10 by a distance di. Distance di is measured from the second surface 14 of the first substrate 10 to the third surface 18 of the second substrate 16. Distance di is designed to permit at least a first electronic component 22 and a connector structure 30 (both of which will be described in greater detail herein below) to be located between the first substrate 10 and the second substrate 16. In one example, distance di is from 5 mm to 10 mm. In the present disclosure, distance di is determined by the height of the connector structure 30 (to be described in greater detail herein below). In the present disclosure, the connector structure 30 is constructed to be tall so as to enable the semiconductor component 38 (to be described in greater detail herein below), which is disposed on the fourth surface 20 of the second substrate 16, to be in close proximity to, and thus make thermal contact with, an external heat sink. The use of a tall connector structure 30 permits efficient system thermal management via a reduced heat dissipation path from the semiconductor component 38 to the external heat sink.

The exemplary power electronic modules of FIGS. 1 and 2 further include a first electronic component 22 located between the second surface 14 of the first substrate 10 and the third surface 18 of the second substrate 16. The first electronic component 22 has a first terminal 24 that electrically contacts the first substrate 10 and a second terminal 26 that electrically contacts the second substrate 16. The first terminal 24 and the second terminal 26 of the first electronic component 22 are connected to each other by an electrically conductive structure 28 that provides a body of the first electronic component 22.

The electrically conductive structure 28, the first terminal 24 and the second terminal 26 are each composed of an electrically conductive metal or electrically conductive metal alloy. Exemplary electrically conductive metals include, but are not limited to, copper (Cu), aluminum (Al), tantalum (Ta), titanium (Ti), tungsten (W), cobalt (Co), ruthenium (Ru), iridium (Ir) or rhodium (Rh). Exemplary electrically conductive metal alloys include, but are not limited to, a Cu—Al alloy. In some embodiments of the present disclosure, the electrically conductive structure 28, the first terminal 24 and the second terminal 26 that provide the first electronic component 22 are of unitary construction (i.e., a single piece) and are composed of a same electrically conductive metal or electrically conductive metal alloy. In one example, the electrically conductive structure 28, the first terminal 24 and the second terminal 26 are each composed of Cu. In other embodiments, the electrically conductive structure 28 is composed of a different electrically conductive metal or electrically conductive metal alloy than at least one of the first terminal 24 or the second terminal 26 of the first electronic component 22.

Figure 3:
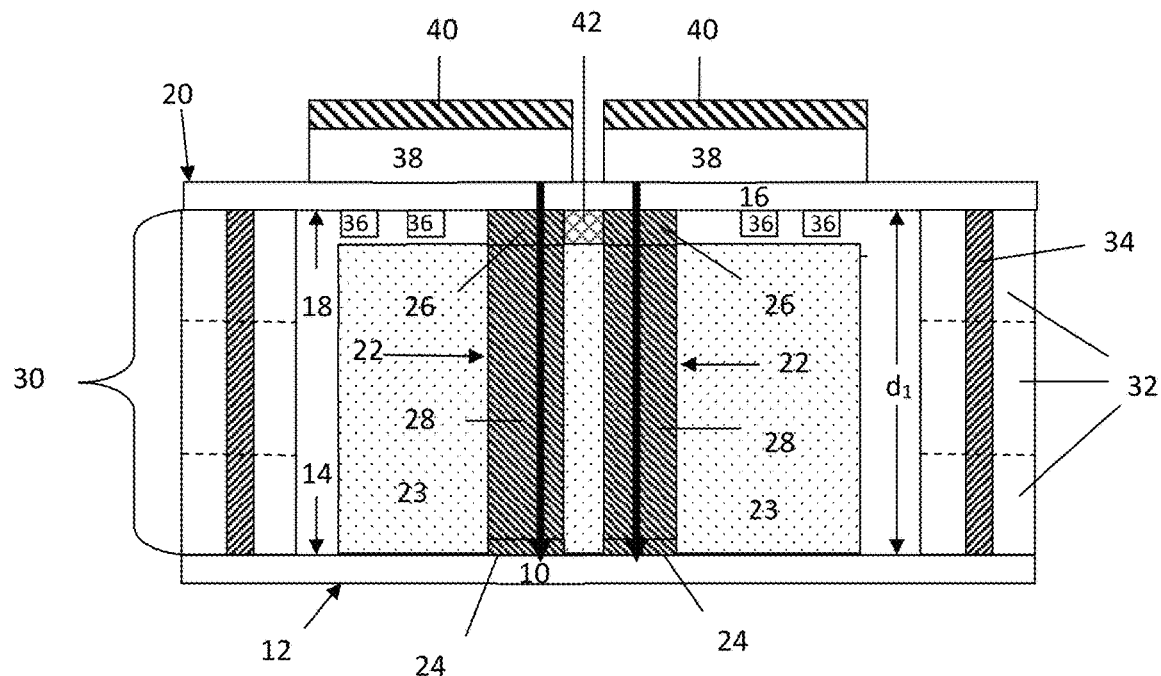
FIG. 3 is a cross-sectional view of a power electronic module in accordance with yet another embodiment of the present disclosure.
Figure 4:
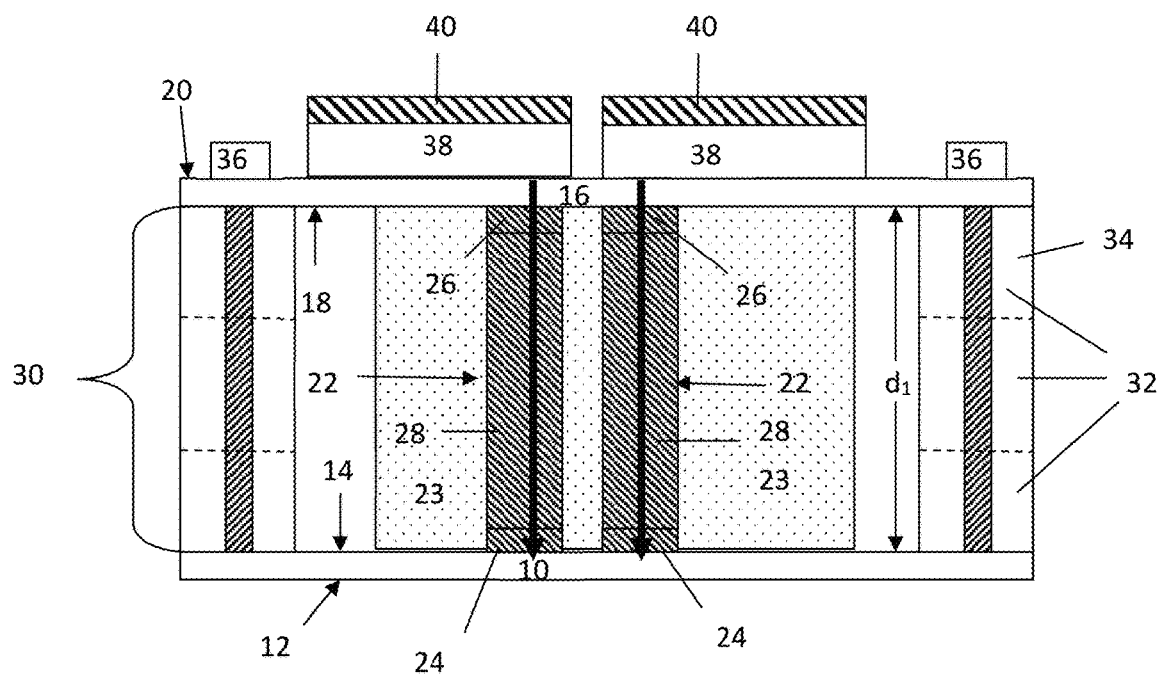
FIG. 4 is a cross-sectional view of a power electronic module in accordance with a further embodiment of the present disclosure.

The electrically conductive structure 28 of the first electronic component 22 is typically, but not necessarily, encased in a housing substrate 23. The housing substrate 23 that encases the electrically conductive structure 28 of the first electronic component 22 is typically composed of a dielectric material. In some embodiments, the housing substrate 23 that encases the electrically conductive structure 28 of the first electronic component 22 can be spaced apart from the connector structure 30. In some embodiments, the housing substrate 23 can be omitted. In some embodiments, and as is shown in FIGS. 1 and 2, a single first electronic component 22 is present, while in other embodiments (as shown in FIGS. 3 and 4) a plurality of first electronic components 22 can be present. In such an embodiment, the electrically conductive structure 28 of each first electronic component 22 can be encased in a same housing substrate 23 or different housing substrates 23. In embodiments in which different housing substrates 23 are employed, an air gap (not shown in FIGS. 3 and 4) can be located between the different housing substrates 23.

In the present disclosure, the first electronic component 22 is a passive device. By "passive device" it is meant that the first electronic component 22 is incapable of controlling current by means of another electrical signal. In one embodiment of the present disclosure, the first electronic component 22 is an inductor. An inductor is passive two-terminal electrical component that stores energy in a magnetic field when electrical current flows through it.

In accordance with the illustrated embodiments shown in FIGS. 1 and 2, the first terminal 24 of the first electronic component 22 is affixed to the second surface 14 of the first substrate 10, while a portion of the second terminal 26 of the first electronic component 22 extends through an opening that is present in the second substrate 16. In FIGS. 1 and 2, portion 26E refers to the portion of the second terminal 26 that extends through the second substrate 16; the extended portion 26E of the second terminal 26 provides for an efficient current pathway as is illustrated by the bolded arrows shown in FIGS. 1 and 2 starting from the semiconductor component 38 and ending at the first substrate 10.

In the illustrated embodiments shown in FIGS. 1 and 2, the second terminal 26 of the first electronic component 22 can electrically contact the semiconductor component 38 in a through-hole type arrangement. For example, the through-hole type arrangement can be a plated through-hole type arrangement. In the through-hole type arrangement, the second substrate 16 can be provided with an opening or hole that goes completely through the second substrate 16 from the third surface 18 to the fourth surface 20. The opening in the second substrate 16 can be formed by techniques including, for example, lithographic patterning and etching. Further, a conductive layer such as a thin Cu layer can be plated onto the sidewall of the second substrate 16 that is provided by the opening that extends from the third surface 18 of the second substrate 16 to the fourth surface 20 of the second substrate 16. With the plated opening, there can be a conductive path from the third surface 18 to the fourth surface 20. The portion 26E of the second terminal 26 can extend through the second substrate 16 via the opening from the third surface 18 and outward from the fourth surface 20. The portion 26E of the second terminal 26 can electrically contact at least the plated sidewall of the second substrate 16. Although not shown in the drawing, the portion 26E of the second terminal 26 that extends through the opening in the second substrate 16 can be soldered to the sidewall (inner wall) of the opening in the second substrate 16. The electrical and mechanical connection between the portion 26E of the second terminal 26 and the plated opening can provide lower resistance and improved mechanical stability.

The second terminal 26 of the first electronic component 22 can alternatively electrically contact the semiconductor component 38 in a non-plated through-hole type arrangement. In the non-plated through-hole type arrangement, no plating is provided on the sidewall of the opening. In this arrangement, the portion 26E of the second terminal 26 that extends through the opening in the second substrate 16 can be soldered to the fourth surface 20 of the second substrate 16 to electrically contact the semiconductor component 38.

The above-described through-hole type arrangement of the second terminal 26 allows for improved or wider manufacturing tolerances in the production of components, such as the connector structure 30 and the first electronic component 22, of the power electronic module. The extending of the portion 26E of the second terminal 26 in the through-hole type arrangement through (i.e., passing through) the second substrate 16 will allow the second terminal 26 of the first electronic component 22 to be connected to the second substrate 16, even if height variation occurs in the connector structure 30 and/or the first electronic component 22.

In the illustrated embodiments shown in FIGS. 1 and 2, the first terminal 24 electrically contacts the second surface 14 of the first substrate 10. The affixing of the first terminal 24 of the first electronic component 22 to the second surface 14 of the first substrate 10 can include using surface mounting technology (SMT). In one example, the SMT can include soldering of the first terminal 24 of the first electronic component 22 to the second surface 14 of the first substrate 10. The aforementioned electrical connection on opposing surfaces of the first electronic component 22 allows a high current path from the first substrate 10 to the second substrate 16 through the body (i.e., the electrically conductive structure 28) of the first electronic component 22 thus improving the module's electrical resistance and reducing the current load on the board to board connectors (i.e., the connector structure 30 to be described in further detail herein below).

In some embodiments and as is shown in FIG. 1, at least one second electronic component 36 can be present on the third surface 18 of the second substrate 16; in this embodiment, the at least one second electronic component 36 is spaced apart from the semiconductor component 38 by the second substrate 16. The placement of the least one second electronic component 36 on the third surface 18 of the second substrate 16 allows for a greater quantity or size of the second electronic component 36 to be used thus improving the electrical performance of the power electronic module. In this embodiment of the present disclosure, there can be more space on the third surface 18 of the second substrate 16 for placement of the second electronic components 36 as compared to the fourth surface 20 of the second substrate 16. A larger quantity of the second electronic components 36 enables more electrical functionality and better performance.

In the illustrated embodiment of FIG. 1, a plurality of spaced apart second electronic components 36 are present on the third surface 18 of the second substrate 16. Each second electronic component 36 is spaced apart from the connector structure 30 as well as being spaced apart from the second terminal 26 of the first electronic component 22. In some embodiments, the at least one second electronic component 36 can be omitted from the exemplary power electronic module shown in FIG. 1. FIG. 2 illustrates a variation of the exemplary power electronic module shown in FIG. 1 with a first set of second electronic components 36 being located on the third surface 18 and a second set of second electronic components 36 (one of which is shown in FIG. 2) being located on the fourth surface 20 of the second substrate 16.

The at least one second electronic component 36 that can be employed in the present disclosure has a different electronic function than that of the first electronic component 22. For example, and when the first electronic component 22 is an inductor, the at least one second electronic component 36 can be a capacitor. As is known to those skilled in the art, capacitors oppose a change in voltage while an inductor opposes a current. In some embodiments, the capacitors are decoupling capacitors. In yet other embodiments, the at least one second electronic component 36 can be a resistor. In some embodiments, the at least one second electronic component 36 can comprise a combination of at least one capacitor and at least one resistor.

In the illustrated embodiment shown in FIG. 1, the at least one second electronic component 36 can be affixed to the third surface 18 of the second substrate 16 by soldering or by using any other affixing means. In the embodiment shown in FIG. 2, the first and second sets of second electronic components 36 can be affixed to the appropriate surface of the second substrate 16 by soldering or by using other affixing means.

The exemplary power electronic modules of FIGS. 1 and 2 further include a connector structure 30 that laterally surrounds the first electronic component 22 and connects the first substrate 10 and the second substrate 16. The connector structure 30 is configured to provide mechanical and electrical connection of the first substrate 10 to the second substrate 16. The connector structure 30 allows an efficient electrical signal path from the semiconductor component 38 through the height of the first electronic component 22 to the first substrate 10. In the present disclosure, the connector structure 30 is constructed to be tall (i.e., having a height equivalent to di above) so as to enable the semiconductor component 38, which is disposed on the fourth surface 20 of the second substrate 16, to make thermal contact with an external heat sink thus permitting efficient thermal management via a reduced heat dissipation path. In some embodiments, the heat sink can include a water-cooled heat sink.

In some embodiments, the connector structure 30 is a single frame board 32 having a plurality of electrically conductive structures 34 embedded therein. In such an embodiment, the single frame board 32 can be comprised of an organic substrate as defined above, or a dielectric material. The plurality of electrically conductive structures 34 that are embedded in the single frame board can include one of the electrically conductive metals or metal alloys mentioned above. Typically, the plurality of electrically conductive structures 34 that are embedded in the single frame board 32 is composed of Cu. A single frame board construction for the connector structure 30 is depicted in FIGS. 1 and 2 (as well as FIGS. 3 and 4) assuming the dotted lines do not represent any material interface within the connector structure 30.

In other embodiments, the connector structure 30 includes a plurality of stacked frame boards 32 having a plurality of electrically conductive structures 34 embedded therein. In such an embodiment, each frame board 32 of the stacked frame boards can be comprised of an organic substrate as defined above, or a dielectric material. The plurality of electrically conductive structures 34 that are embedded in the frame boards 32 can include one of the electrically conductive metals or metal alloys mentioned above. Typically, the plurality of electrically conductive structures 34 included in the stacked frame boards 32 is composed of Cu. Stacking of each frame board 32 may include soldering. In FIGS. 1 and 2 (as well as FIGS. 3 and 4), stacked frame boards 32 are depicted assuming the dotted line represents a material interface between each stacked frame board 32.

In either of the frame board embodiments mentioned above, the electrically conductive structures 34 extend entirety through the frame board construction, but not beyond the frame board construction, such that each electrically conductive structure 34 in the frame board construction has a first surface that contacts the second surface 14 of the first substrate 10, and a second surface, opposite the first surface, that contacts the third surface 18 of the second substrate 16.

Figure 5:
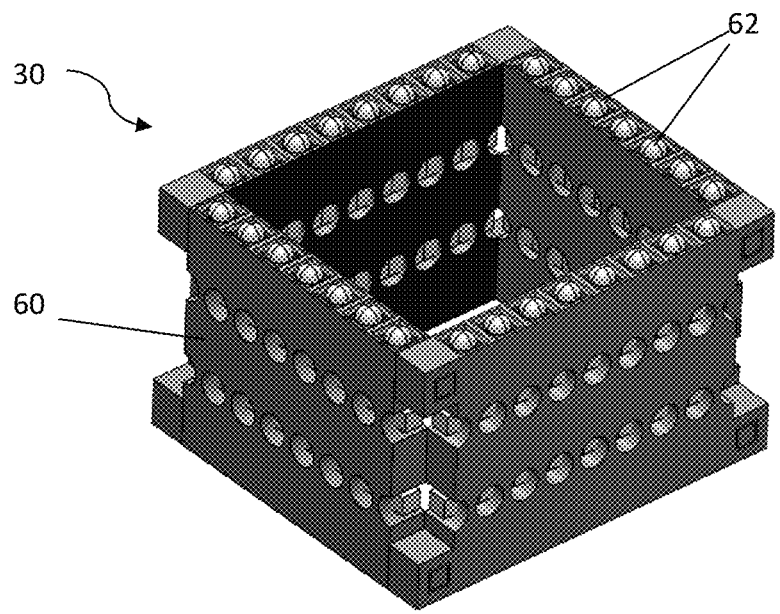
FIG. 5 is a three-dimensional view of an exemplary connector structure that can be employed in the power electronic modules of the present disclosure.
Figure 6:
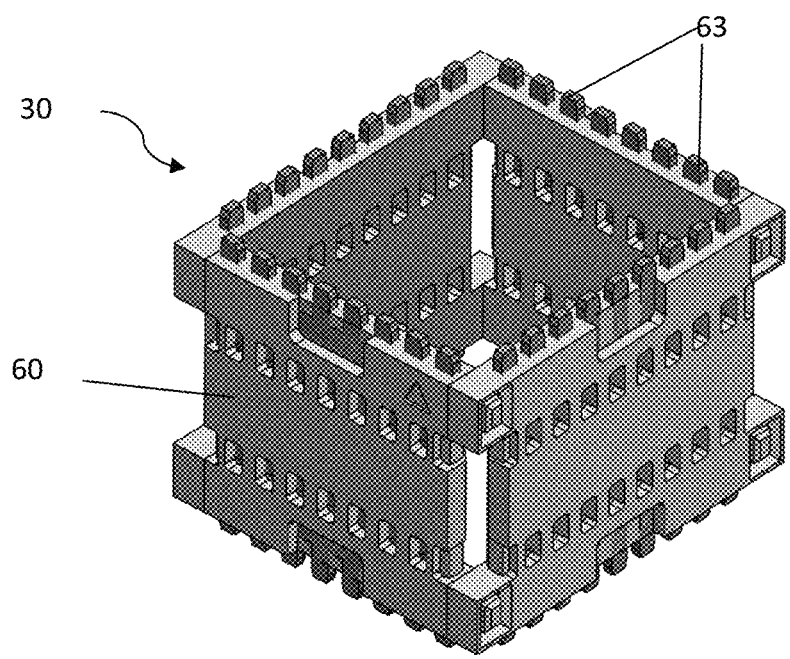
FIG. 6 is a three-dimensional view of another exemplary connector structure that can be employed in the power electronic modules of the present disclosure.

FIG. 5 shows a connector structure 30 in accordance with an embodiment of the present disclosure in which the ends of the electrically conductive structures (not shown) include solder balls 62. FIG. 6 shows a connector structure 30 in accordance with a further embodiment of the present disclosure in which the ends of the electrically conductive structures (not shown) contain electrically conductive pins 63. In either embodiment, the housing substrate 60 can be composed of a plastic material. The solder balls 62 can be composed of any solder material. The electrically conductive pins 63 can be composed of Cu or another like electrically conductive metal or metal alloy. In the embodiment shown in FIG. 6, the electrically conductive pins 63 extend beyond the outer surfaces of the housing substrate 60 such that only the electrically conductive pins 63 of the connector structure 30 contact the respective surfaces of the first substrate 10 and the second substrate 16.

Figure 7:
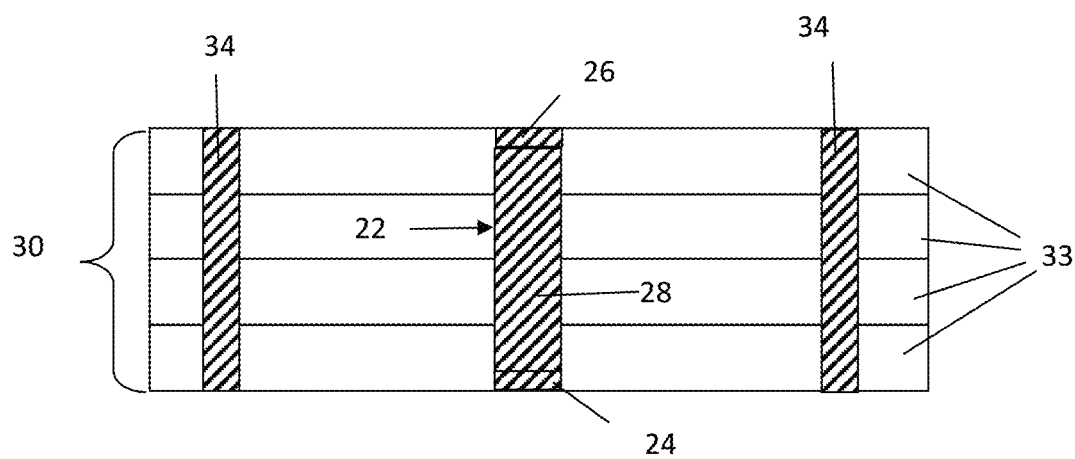
FIG. 7 is a cross-sectional view of yet another exemplary connector structure that can be employed in the power electronic modules of the present disclosure.

In yet another embodiment of the present disclosure and as is shown in FIG. 7, the connector structure 30 includes a plurality of vertically stacked substrates 33 (typically organic or dielectric) having a plurality of electrically conductive structures 34 (e.g., Cu) embedded therein. In such an embodiment, the first electronic component 22 (including at least the electrically conductive structure (i.e., body) 28) is embedded in the plurality of vertically stacked substrates 33 yet spaced apart from the electrically conductive structures 34 by a portion of the vertical stacked substrates 33. In the illustrated embodiment shown in FIG. 7, the first terminal 24 and the second terminal 26 of the first electronic component 22 are also embedded in the vertically stacked substrates 33. Stacking of each substrate 33 may include soldering one substrate 33 atop another substrate 33. Although not shown, at least one second electronic component 36 can also be embedded in an upper portion of the vertically stacked substrates 33 such that contact can be made with the third surface 18 of the second substrate 16.

The exemplary power electronic modules of FIGS. 1 and 2 further include the semiconductor component 38 located on the fourth surface 20 of the second substrate 16. The semiconductor component 38 can be affixed to the fourth surface 20 of the second substrate 16 by soldering. In accordance with the present disclosure, the semiconductor component 38 is electrically connected with the first substrate 10 via the first terminal 24 and the second terminal 26 of the first electronic component 22.

Figure 8:
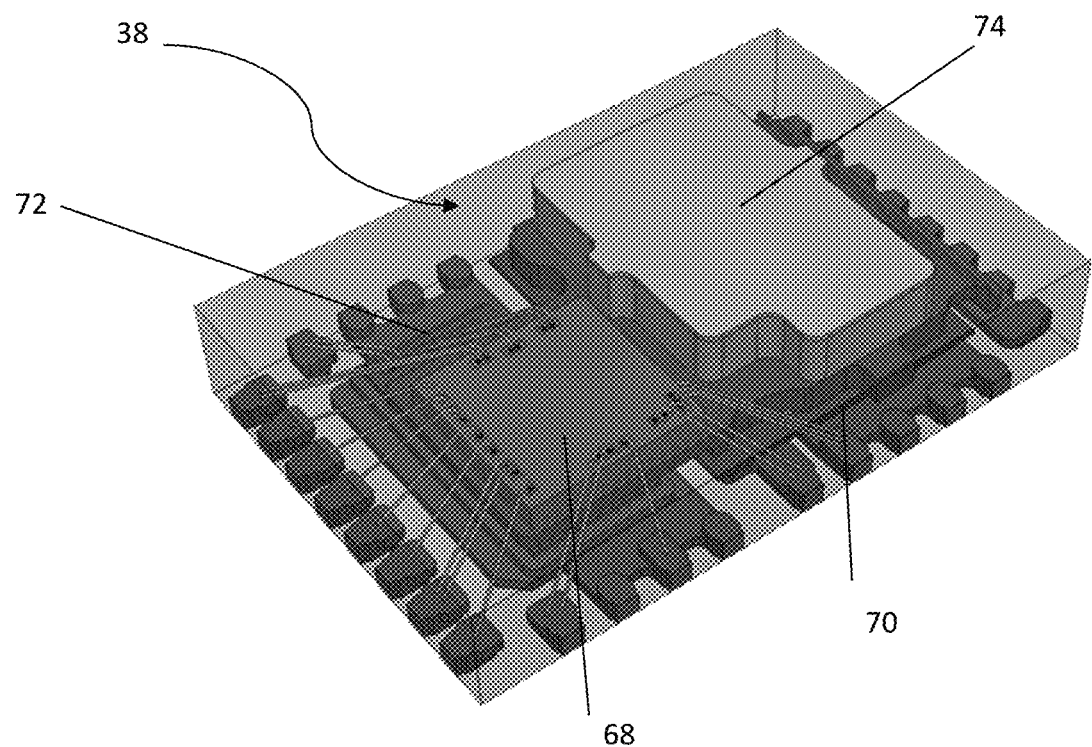
FIG. 8 is a pictorial representation of an exemplary semiconductor component that can be employed in the power electronic modules of the present disclosure.

In some embodiments, the semiconductor component 38 is a smart power stage component. The smart power stage component that can be employed can include an integrated driver 68, a power converter having switching elements comprising, for example, a high side (or upper) MOSFET 72 and a low side (or lower) MOSFET 70, and a heat slug 74 that is arranged to dissipate heat away from the power converter, as is shown, for example, in FIG. 8. In other embodiments, the semiconductor component 38 can comprise a Driver and MOSFET module (DrMOS), a discrete power Si MOSFET, a GaN MOSFET, or a SiC MOSFET. The semiconductor component 38 can also comprise any combination of the aforementioned types of semiconductor components 38.

The heat slug 74 can be attached, for example, to a clip packaging structure of the semiconductor component 38. The heat slug 74 can include any high conductance metal or metal alloy which permits heat to dissipate from the power converter to an external heat sink (not shown) of an external device. In one example, the heat slug 74 includes Cu. Further, the heat slug 74 can be exposed on a surface of the semiconductor component 38 to come into thermal contact with the heat sink. For example, the heat slug 74 can contact the heat sink, or the heat slug 74 can contact a metallic spacer 40 (as shown in FIGS. 1, 2, 3 and 4) which contacts the heat sink to provide a thermal dissipation path from the semiconductor component 38 to the heat sink. The metallic spacer 40 can include any high conductance metal or metal alloy which permits heat to dissipate from the semiconductor component 38 to the heat sink. In one example, the metallic spacer 40 includes Cu. The metallic spacer 40 can be affixed to the semiconductor component 38 by soldering or using a thermal interface material.

Referring now to FIG. 3, there is illustrated a power electronic module in accordance with another embodiment of the present disclosure. The power electronic module of FIG. 3 includes a first substrate 10 having a first surface 12 and a second surface 14 opposite the first surface 12, and a second substrate 16 spaced apart from the first substrate 10 and having a third surface 18 and a fourth surface 20 that is opposite the third surface 18, wherein the third surface 18 of the second substrate 16 faces the second surface 14 of the first substrate 10.

The illustrated power electronic module of FIG. 3 further includes a pair of first electronic components 22 located between the second surface 14 of the first substrate 10 and the third surface 18 of the second substrate 16. In this embodiment, each first electronic component 22 has a first terminal 24 and a second terminal 26. Each first terminal 24 is connected to a respective second terminal 26 by an electrically conductive structure 28 that provides the body of a respective first electronic component 22. In this embodiment of the present disclosure, the first terminals 24 of the pair of first electronic components 22 electrically contact the second surface 14 of the first substrate 10 and the second terminals 26 of the pair of first electronic components 22 electrically contact the third surface 18 of the second substrate 16. In this embodiment, the second terminals 26 of the pair of first electronic components 22 can be soldered to the third surface 18 of the second substrate 16. In FIG. 3, element 42 denotes a thermal interface material that can be located between each second terminal 26. In this embodiment of the present disclosure, each electrically conductive structure 28 that provides the body of a respective first electronic component 22 is embedded in a single housing substrate 23.

A connector structure 30 (including any of the various connector structures mentioned above for the embodiments illustrated in FIGS. 1 and 2) laterally surrounds the first electronic component 22 and connects the first substrate 10 and the second substrate 16.

In this embodiment, a pair of spaced apart semiconductor components 38 (e.g., smart power stage components) is illustrated and each is located on the fourth surface 20 of the second substrate 16. As is the previous embodiments shown in FIGS. 1 and 2, each semiconductor component 38 is electrically connected with the first substrate 10 via one of the first terminals 24 and one of the second terminals 26 of a corresponding first electronic component 22. As is shown in FIG. 3, each semiconductor component 38 includes a metallic spacer 40 located thereon.

In the illustrated embodiment shown in FIG. 3, the power electronic module further includes second electronic components 36 that are spaced apart from the first electronic components 22 and are located on the third surface 18 of the second substrate 16. In some embodiments, the second electronic components 36 can be omitted. In yet other embodiments (not shown), a first set of the second electronic components 36 is located on the third surface 18 of the second substrate 16, and a second set of the second electronic components 36 is located on the fourth surface 20 of the second substrate 16.

In the illustrated embodiment of FIG. 3 (and FIG. 4 to be described herein below), the current path starts from each semiconductor component 38 and travels to the first substrate 10 by traversing through the second substrate 16, the second terminal 26, the electrically conductive structure 28 and the first terminal 24. This is illustrated by the bolded arrows shown in FIGS. 3 and 4.

Referring now to FIG. 4, there is illustrated a power electronic module in accordance with yet another embodiment of the present disclosure. The power electronic module of FIG. 4 includes a first substrate 10 having a first surface 12 and a second surface 14 opposite the first surface 12, and a second substrate 16 spaced apart from the first substrate 10 and having a third surface 18 and a fourth surface 20 that is opposite the third surface 18, wherein the third surface 18 of the second substrate 16 faces the second surface 14 of the first substrate 10.

The illustrated power electronic module of FIG. 4 further includes a pair of first electronic components 22 located between the second surface 14 of the first substrate 10 and the third surface 18 of the second substrate 16. In this embodiment, each first electronic component 22 has a first terminal 24 and a second terminal 26. Each first terminal 24 is connected to a respective second terminal 26 by an electrically conductive structure 28. In this embodiment of the present disclosure, the first terminals 24 of the pair of first electronic components 22 electrically contact the second surface 14 of the first substrate 10 and the second terminals 26 of the pair of first electronic components 22 electrically contact the third surface 18 of the second substrate 16. In this embodiment, the second terminals 26 of the pair of first electronic components 22 can be soldered to the third surface 18 of the second substrate 16. In this embodiment of the present disclosure, each electrically conductive structure 28 that provides the body of a respective first electronic component 22 is embedded in a single housing substrate 23.

A connector structure 30 (including any of the various connector structures mentioned above for the embodiments illustrated in FIGS. 1 and 2) laterally surrounds the first electronic component 22 and connects the first substrate 10 and the second substrate 16.

In this embodiment of the present disclosure, a pair of spaced apart semiconductor components 38 (e.g., smart power stage components) is illustrated and each is located on the fourth surface 20 of the second substrate 16. As is the previous embodiments shown in FIGS. 1, 2 and 3, each semiconductor component 38 is electrically connected with the first substrate 10 via the first terminal 24 and the second terminal 26 of a corresponding first electronic component 22. As is shown in FIG. 4, each semiconductor components 38 includes a metallic spacer 40 located thereon.

In the illustrated embodiment shown in FIG. 4, the power electronic module further includes second electronic components 36 that are spaced apart from the first electronic component 22 (by the second substrate 16) and are located on the fourth surface 20 of the second substrate 16. In this embodiment, the second electronic components 36 are affixed to the fourth surface 20 by solder or using a thermal interface material. Placing the second electronic components 36 on the fourth surface 20 of the second substrate 16 allows for the shortest electrical path of the second electronic components 36 to the semiconductor components 38. Such a short electrical path, in turn, reduces electrical parasitics of the power electronic module of the present disclosure. In some embodiments, the second electronic component 36 can be omitted.

It is noted that the number of first electronic components 22 is not limited to the specific embodiments illustrated in FIGS. 1, 2, 3 and 4. Instead, any number of first electronic components 22 can be used. In the present disclosure, the number of first electronic components 22 correlates to the number of semiconductor components 38 that are present on the fourth surface 20 of the second substrate 16. That is, a single first electronic component 22 is used in conjunction with a single semiconductor component 38.

Figure 9:
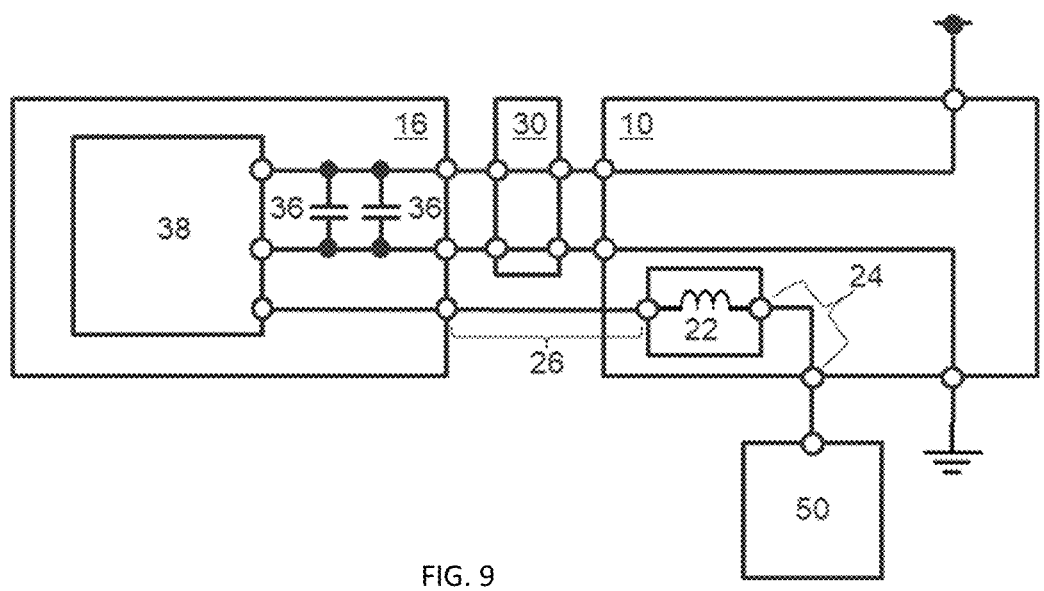
FIG. 9 is a circuit diagram showing the electronic coupling of the power electronic modules of the present disclosure with a GPU/CPU/microprocessor.

The power electronic module of the present disclosure (including the power electronic modules illustrated in FIGS. 1-4) can be mounted directly to GPU/CPU/microprocessor boards. As mentioned previously, the power electronic module of the present disclosure (including the power electronic modules illustrated in FIGS. 1-4) allows a high current path from the top board to the bottom board through the body of the first electronic component thus improving the power electronic module's electrical resistance and reducing the current load on the current travel path. Here, as shown in FIG. 9, the semiconductor component (i.e., smart power stage component) 38, which is disposed on the fourth surface 20 of the second substrate 16, is electrically coupled with GPU/CPU/microprocessor 50 mounted on the GPU/CPU/microprocessor boards via the first electronic component (i.e., inductor) 22. That is, the second terminal 26 of the first electronic component 22 is electrically connected with the second substrate 16 on which the semiconductor component 38 is disposed without going through the plurality of electrically conductive structures 34 embedded in the connector structure 30. Therefore, it is possible to improve the power electronic module's electrical resistance and to reduce the current load on the current travel path from the semiconductor component 38 to the first electronic component 22. The location of the semiconductor component 38 of the power electronic module of the present disclosure allows for thermal contact of the semiconductor component 38 with an external heat sink thus providing an efficient system thermal management via a reduced heat dissipation path. Additional heat dissipation can be obtained by disposing a metallic spacer 40 on the semiconductor component 38.

While the present disclosure has been particularly shown and described with respect to preferred embodiments thereof, it will be understood by those skilled in the art that the foregoing and other changes in forms and details may be made without departing from the spirit and scope of the present application. It is therefore intended that the present disclosure not be limited to the exact forms and details described and illustrated, but fall within the scope of the appended claims.

What is claimed is:

1. A power electronic module comprising: a first substrate having a first surface and a second surface opposite the first surface; a second substrate spaced apart from the first substrate and having a third surface and a fourth surface that is opposite the third surface, wherein the third surface of the second substrate faces the second surface of the first substrate; a first electronic component located between the second surface of the first substrate and the third surface of the second substrate, the first electronic component having a first terminal and a second terminal; wherein the first electronic component comprises an inductor; a second electronic component spaced apart from the first electronic component and located on the second substrate, wherein the second electronic component comprises at least one capacitor; a connector structure laterally surrounding the first electronic component and connecting the first substrate and the second substrate; and a semiconductor component located on the fourth surface of the second substrate, wherein the semiconductor component is electrically connected with the first substrate via the first terminal and the second terminal, and the first terminal of the first electronic component electrically contacts the first substrate, and the second terminal of the first electronic component electrically contacts the second substrate.

2. The power electronic module of claim 1, wherein the first terminal and the second terminal are connected to each other by an electrically conductive structure that provides a body of the inductor.

3. The power electronic module of claim 1, wherein the semiconductor component is a smart power stage component having a metallic spacer located on a surface thereof.

4. The power electronic module of claim 3, further comprising a heat slug thermally contacting the metallic spacer.

5. The power electronic module of claim 3, wherein the smart power stage component comprises at least a power converter having a switching element comprising a high side metal MOSFET and a low side MOSFET.

6. The power electronic module of claim 2, wherein the second electronic component is located on the third surface of the second substrate.

7. The power electronic module of claim 6, wherein the first terminal of the first electronic component electrically contacts the second surface of the first substrate and a portion of the second terminal of the first electronic component extends through the second substrate.

8. The power electronic module of claim 6, wherein the first terminal of the first electronic component electrically contacts the second surface of the first substrate and the second terminal of the first electronic component electrically contacts the third surface of the second substrate.

9. The power electronic module of claim 2, wherein the second electronic component is located on the fourth surface of the second substrate and is spaced apart from the semiconductor component.

10. The power electronic module of claim 9, wherein the first terminal of the first electronic component electrically contacts the second surface of the first substrate and the second terminal of the first electronic component electrically contacts the third surface of the second substrate.

11. The power electronic module of claim 1, wherein the first terminal and the second terminal are connected to each other by an electrically conductive structure that provides a body of the first electronic component.

12. The power electronic module of claim 1, wherein the first electronic component is disposed in a housing substrate that is spaced apart from the connector structure.

13. The power electronic module of claim 1, wherein the connector structure comprises a frame board having a plurality of electrically conductive structures embedded therein.

14. The power electronic module of claim 1, wherein the connector structure comprises a housing substrate having a plurality of electrically conductive structures embedded therein, wherein an electrically conductive pin is located at an end of each of the plurality of electrically conductive structures.

15. The power electronic module of claim 14, wherein the electrically conductive pin is composed of one of Cu, an electrically conductive metal, and a metal alloy.

16. The power electronic module of claim 14, wherein the electrically conductive pin extends beyond an outer surface of the housing substrate such that only the electrically conductive pin contacts the respective surfaces of the first substrate and the second substrate.

17. The power electronic module of claim 1, wherein the connector structure comprises a plurality of vertically stacked substrates having a plurality of electrically conductive structures embedded therein.

18. The power electronic module of claim 17, wherein the first electronic component is embedded in the plurality of vertically stacked substrates.

19. The power electronic module of claim 1, wherein the first terminal of the first electronic component electrically contacts the second surface of the first substrate and a portion of the second terminal of the first electronic component extends through the second substrate.

20. The power electronic module of claim 1, wherein the first terminal of the first electronic component electrically contacts the second surface of the first substrate and the second terminal of the first electronic component electrically contacts the third surface of the second substrate.

\* \* \* \* \*